United States Patent
Lai et al.

(10) Patent No.: US 10,269,776 B2
(45) Date of Patent: *Apr. 23, 2019

(54) LIGHT EMITTING DEVICE

(71) Applicant: PlayNitride Inc., Tainan (TW)

(72) Inventors: Yu-Hung Lai, Tainan (TW); Tzu-Yang Lin, Tainan (TW)

(73) Assignee: PlayNitride Inc., Tainan (TW)

( * ) Notice: Subject to any disclaimer, the term of this patent is extended or adjusted under 35 U.S.C. 154(b) by 0 days.

This patent is subject to a terminal disclaimer.

(21) Appl. No.: 15/498,484

(22) Filed: Apr. 27, 2017

(65) Prior Publication Data

US 2017/0229430 A1    Aug. 10, 2017

Related U.S. Application Data

(63) Continuation-in-part of application No. 14/944,236, filed on Nov. 18, 2015, now Pat. No. 9,666,564.

(30) Foreign Application Priority Data

Oct. 23, 2015    (TW) .............................. 104134825 A

(51) Int. Cl.
*H01L 25/07* (2006.01)
*H01L 25/075* (2006.01)
(Continued)

(52) U.S. Cl.
CPC .......... *H01L 25/0753* (2013.01); *H01L 33/46* (2013.01); *H01L 33/62* (2013.01);
(Continued)

(58) Field of Classification Search
CPC ..... H01L 25/0753; H01L 33/46; H01L 33/62; H01L 33/382; H01L 33/60
See application file for complete search history.

(56) References Cited

U.S. PATENT DOCUMENTS 6,325,524 B1    12/2001  Weber et al.
9,666,564 B2 *   5/2017  Lai ...................... H01L 25/0753
(Continued)

FOREIGN PATENT DOCUMENTS

TW            200522399          7/2005

OTHER PUBLICATIONS

"Office Action of Taiwan Counterpart Application," dated Feb. 22, 2017, p. 1-p. 7, in which the listed references were cited.

*Primary Examiner* — Matthew L Reames
(74) *Attorney, Agent, or Firm* — JCIPRNET

(57) ABSTRACT

A light emitting device includes a substrate, micro light emitting chips, reflective structures and conductive bumps. The substrate has pads. The micro light emitting chips are disposed on the substrate separately, and each of the micro light emitting chips includes a light emitting layer, a first type electrode and a second type electrode isolated from the first type electrode, wherein the first type electrode and the second type electrode are disposed on one side of the light emitting layer. The reflective structures are physically separated from each other and spaced apart from the substrate. Each of the reflective structures is disposed around one of the micro light emitting chips. The conductive bumps and located between the micro light emitting chips and the substrate, wherein the micro light emitting chips are electrically boned to the pads of the substrate through the conductive bumps.

6 Claims, 5 Drawing Sheets

Related U.S. Application Data

(60) Provisional application No. 62/092,265, filed on Dec. 16, 2014.

(51) Int. Cl.
  *H01L 33/46* (2010.01)
  *H01L 33/62* (2010.01)
  *H01L 33/38* (2010.01)
  *H01L 33/60* (2010.01)

(52) U.S. Cl.
  CPC ............ *H01L 33/382* (2013.01); *H01L 33/60* (2013.01); *H01L 2224/16225* (2013.01); *H01L 2924/0002* (2013.01)

(56) References Cited

U.S. PATENT DOCUMENTS

| | | |
|---|---|---|
| 2010/0051984 A1 | 3/2010 | West |
| 2012/0223345 A1 | 9/2012 | Tomoda et al. |
| 2013/0187179 A1 | 7/2013 | Tan et al. |
| 2014/0159064 A1 | 6/2014 | Sakariya et al. |
| 2014/0361705 A1 | 12/2014 | Bibl et al. |
| 2015/0270448 A1* | 9/2015 | Chyu .................. H01L 33/46 257/98 |
| 2016/0211422 A1* | 7/2016 | Kazama ............... H01L 33/502 |

* cited by examiner

LIGHT EMITTING DEVICE

CROSS-REFERENCE TO RELATED APPLICATION

This application is a continuation-in-part application of and claims the priority benefit of U.S. application Ser. No. 14/944,236, filed on Nov. 18, 2015, now allowed, which claims the priority benefits of U.S. provisional application Ser. No. 62/092,265, filed on Dec. 16, 2014, and Taiwan application serial no. 104134825, filed on Oct. 23, 2015. The entirety of each of the above-mentioned patent applications is hereby incorporated by reference herein and made a part of this specification.

BACKGROUND OF THE INVENTION

Field of the Invention

The invention relates to a semiconductor device, and particularly relates to a light emitting device.

Description of Related Art

Generally, a light-emitting diode (LED) light source module includes a plurality of LED chips arranged on a substrate in a matrix. However, lateral lights emitted by two LED chips adjacent to each other are absorbed by each other, such that the lateral lights emitted by the LED chips cannot be effectively used, which decreases light emitting efficiency of the LED light source module.

SUMMARY OF THE INVENTION

The invention is directed to a light emitting device, which has better light emitting efficiency and light emitting uniformity.

The invention provides a light emitting device including a substrate, a plurality of micro light emitting chips, a plurality of reflective structures and a plurality of conductive bumps. The substrate has a plurality of pads. The micro light emitting chips are disposed on the substrate separately, and each of the micro light emitting chips includes a light emitting layer, a first type electrode and a second type electrode isolated from the first type electrode, wherein the first type electrode and the second type electrode are disposed on one side of the light emitting layer. The reflective structures are physically separated from each other and spaced apart from the substrate. Each of the reflective structures is disposed around one of the micro light emitting chips. The conductive bumps are disposed corresponding to the micro light emitting chips and located between the micro light emitting chips and the substrate, where the micro light emitting chips are electrically bonded to the pads of the substrate through the conductive bumps.

In an embodiment of the invention, each of the micro light emitting chips further includes a first type semiconductor layer and a second type semiconductor layer. The light emitting layer is located between the first type semiconductor layer and the second type semiconductor layer. The first type electrode is electrically connected to the first type semiconductor layer, and the second type electrode is electrically connected to the second type semiconductor layer.

In an embodiment of the invention, each of the micro light emitting chips further includes a via hole, and the via hole penetrates through the first type semiconductor layer and the light emitting layer. The second type electrode is disposed within the via hole to electrically contact the second type semiconductor layer.

In an embodiment of the invention, each of the micro light emitting chips further includes an insulating layer. The insulating layer is disposed on the first type semiconductor layer and a sidewall of the via hole, wherein the insulating layer exposes a portion of the surface of the first type semiconductor layer to form a contact opening. The first type electrode is disposed on the contact opening to contact the first type semiconductor layer, and the insulating layer exposes the second type semiconductor layer in the via hole.

In an embodiment of the invention, each of the reflective structures extends to cover the surface of the first type semiconductor layer and is disposed between a side wall of the via hole and the second type electrode. Each of the reflective structures exposes a portion of the surface of the first type semiconductor layer to form a contact opening, and the first type electrode is disposed on the contact opening to contact the first type semiconductor layer.

In an embodiment of the invention, a thickness of one of the reflective structures is thinning gradually toward the substrate. Each of the reflective structures directly covers side surfaces of the first semiconductor layer and side surfaces of the light emitting layer of each of the micro light emitting chips.

In an embodiment of the invention, each of the reflective structures extends to cover a bonding surface of one of the micro light emitting chips and the bonding surface faces to the substrate. Each of the reflective structures exposes a portion of the first type semiconductor layer to form a first contact opening, and the first type electrode is disposed on the first contact opening. Each of the reflective structures exposes a portion of the second type semiconductor layer to form a second contact opening, and the second type electrode is disposed on the second contact opening.

In an embodiment of the invention, each of the reflective structures covers side surface of one of the micro light emitting chips at the same thickness.

In an embodiment of the invention, a material of the reflective structures is an insulating material.

In an embodiment of the invention, each of the reflective structures is a multi-layer structure.

In an embodiment of the invention, a maximum peak current density of an external quantum efficiency curve of each of the micro light emitting chips is between 0.01 A/cm$^2$ and 2 A/cm$^2$.

In an embodiment of the invention, a defect density of each of the micro light emitting chips is between 10$^4$/cm$^2$ and 10$^8$/cm$^2$.

According to the above descriptions, since the light emitting device of the invention has the reflective structures, where the reflective structures are disposed around the micro light emitting chips, and at least cover the light emitting layers of the micro light emitting chips, a forward light flux of the light emitting device is enhanced and a lateral light flux thereof is decreased. Moreover, by using the reflective structures, the lights emitted by the light emitting layers of the micro light emitting chips may have a uniform light emitting effect through reflection. In this way, the light emitting device of the invention may achieve better light emitting efficiency and light emitting uniformity.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1A:
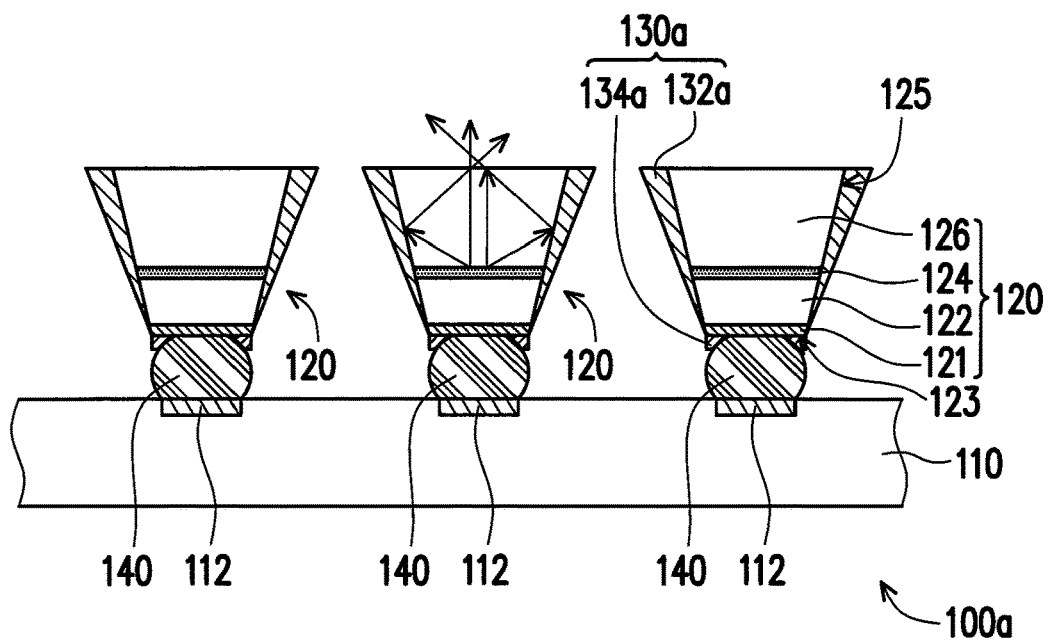
FIG. 1A is a cross-sectional view of a light emitting device according to an embodiment of the invention.

FIG. 1A is a cross-sectional view of a light emitting device according to an embodiment of the invention. Referring to FIG. 1A, the light emitting device 100a include a substrate 110, a plurality of micro light emitting chips 120, a plurality of reflective structures 130a and a plurality of conductive bumps 140. The substrate 110 has a plurality of pads 112. The micro light emitting chips 120 are disposed on the substrate 110 in dispersion, and each of the micro light emitting chips 120 includes a light emitting layer 124. The reflective structures 130a are disposed around the micro light emitting chips 120 in dispersion, and at least cover the light emitting layers 124 of the micro light emitting chips 120. The conductive bumps 140 are disposed corresponding to the micro light emitting chips 120 and located between the micro light emitting chips 120 and the substrate 110, where the micro light emitting chips 120 are electrically connected to the pads 112 of the substrate 110 through the conductive bumps 140.

Figure 1B:
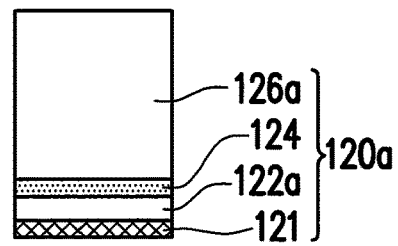
FIG. 1B to FIG. 1C are cross-sectional views of a light emitting chip according to two embodiments of the invention.
Figure 1C:
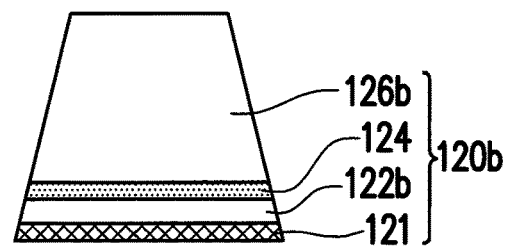

In detail, the substrate 110 of the present embodiment is embodied as a driving substrate, which is, for example, a circuit substrate, a display substrate, a lighting substrate, a substrate having transistors or integrated circuits (Ics) or a substrate having meal redistribution lines, which is not limited by the invention. As shown in FIG. 1A, the pads 112 are embedded in the substrate 110, though in other embodiment that is not illustrated, the pads can also be disposed on a surface of the substrate, which is still within a protection range of the invention. Each of the micro light emitting chips 120 further includes a first type semiconductor layer 122, a second type semiconductor layer 126 and a bonding pad 121. The light emitting layer 124 is located between the first type semiconductor layer 122 and the second type semiconductor layer 126, and the bonding pad 121 is located between the first type semiconductor layer 122 and the substrate 110 and is electrically connected to the conductive bump 140. As shown in FIG. 1A, a profile of the micro light emitting chip 120 is embodied as an inverted trapezoid, where an area of the second type semiconductor layer 126 is greater than an area of the first type semiconductor layer 122, though the invention is not limited thereto. In another embodiment, referring to FIG. 1B, the profile of the micro light emitting chip 120a is embodied as a rectangle, where the area of the second type semiconductor layer 126a of the micro light emitting chip 120a is slightly greater than the area of the first type semiconductor layer 122a ; or referring to FIG. 1C, the profile of the micro light emitting chip 120b is embodied as a trapezoid, where the area of the second type semiconductor layer 126b of the micro light emitting chip 120b is smaller than the area of the first type semiconductor layer 122b. In the micro light emitting chip 120 of the present embodiment, the first type semiconductor layer 122 is, for example, a P-type semiconductor layer, the second type semiconductor layer 126 is, for example, an N-type semiconductor layer, and the light emitting layer 124 is a multiple quantum well (MQW) structure. In other embodiment that is not illustrated, the first type semiconductor layer 122 can be an N-type semiconductor layer, the second type semiconductor layer 126 can be a P-type semiconductor layer, and the light emitting layer 124 is a MQW structure.

As shown in FIG. 1A, a thickness of the second type semiconductor layer 126 of the present embodiment is greater than a thickness of the first type semiconductor layer 122, where the thickness of the second type semiconductor layer 126 is, for example, 3 μm, and the thickness of the first type semiconductor layer 122 is, for example, 0.5 μm. Therefore, the light emitting layers 124 are closer to the conductive bumps 140 and the pads 112 of the substrate 110, such that the heat generated by the micro light emitting chips 120 can be effectively transmitted to external through the conductive bumps 140 and the substrate 110, so as to achieve a better heat dissipation effect of the light emitting device 100a. Moreover, a maximum peak current density of an external quantum efficiency curve of each of the micro light emitting chips 120 of the present embodiment is preferably between 0.01 A/cm$^2$ and 2 A/cm$^2$. Namely, the micro light emitting chips 120 of the present embodiment are adapted to operate under a low current density. Moreover, each of the micro light emitting chips 120 of the present embodiment may serve as a sub-pixel in a display, and the micro light emitting chip 120 of the present embodiment has a different dimension specification with that of the commonly-used light emitting diode (LED) chip. In detail, a side length dimension of the commonly used LED chip is 0.2 mm to 1 mm, and a side length dimension of each of the micro light emitting chips 120 of the present embodiment is 1 μm to 100 μm, preferably, the side length dimension of each of the micro light emitting chips 120 is 3 μm to 40 μm. Moreover, a defect density of each of the micro light emitting chips 120 of the present embodiment is relatively lower, and preferably the defect density of each of the micro light emitting chips 120 is between 10$^4$/cm$^2$ and 10$^8$/cm$^2$. Moreover, the micro light emitting chips 120 of the present embodiment can be light emitting chips of a same color, or include at least one red light emitting chip, at least one green light emitting chip and at least one blue light emitting chip, which is not limited by the invention.

Moreover, each of the reflective structures 130a of the present embodiment includes a first reflective structure 132a, where the first reflective structure 132a directly covers a side surface 125 of each of the micro light emitting chips 120, and the first reflective structures 132a are not connected to each other. As shown in FIG. 1A, the side surface 125 of each of the micro light emitting chips 120 is directly covered by the first reflective structure 132a. In other words, the first reflective structures 132a directly cover the light emitting layers 124 of the micro light emitting chips 120, where the first reflective structures 132a are, for example, insulation reflective layers, which not only effectively protect the light emitting layers 124 of the micro light emitting chips 120, but also have an effect of preventing current leakage. Moreover, the thickness of the first reflective structures 132a of the reflective structures 130a is not consistent, i.e. the thickness of each of the first reflective structures 132a located adjacent to one side of the substrate 110 is smaller than a thickness of each of the first reflective structures 132a located away from the side of the substrate 110. In other words, the farther the first reflective structure 132a is away from the substrate 110, the thicker the thickness thereof is, which avoids an optical crosstalk phenomenon between the micro light emitting chips 120, such that when each of the micro light emitting chips 120 serves as a sub-pixel of a display, the display quality of the display is better.

Moreover, each of the reflective structures 130a further includes a second reflective structure 134a, where the second reflective structure 134a covers a lower surface 123 of each of the micro light emitting chips 120 and exposes a part of the lower surface 123, and the conductive bumps 140 respectively and directly contact the lower surfaces 123 exposed by the second reflective structures 134a. Each of the second reflective structures 134a is, for example, a conductive reflective layer, which not only has a reflection function, but also is capable of electrically connecting the conductive bump 140.

Since the light emitting device 100a of the present embodiment has the reflective structures 130a, where the first reflective structure 132a of each of the reflective structures 130a directly covers the side surface 125 of each of the micro light emitting chips 120, and the second reflective structure 134a of each of the reflective structures 130a covers the lower surface 123 of each of the micro light emitting chips 120 and exposes a part of the lower surface 123, namely, the side surface 125 and the lower surface 123 of the micro light emitting chip 120 are all configured with the reflective structure 130a, the forward light flux of the light emitting device 100a can be enhanced through the configuration of the first reflective structures 132a, and the lateral light flux can be decreased. Moreover, regarding the light emitting uniformity of the light emitting device 100a, by configuring the second reflective structures 134a, reflection of the lights emitted by the light emitting layers 124 of the micro light emitting chips 120 is enhanced, so as to improve the whole light emitting uniformity of the light emitting device 100a. In brief, the light emitting device 100a of the present embodiment may have better light emitting efficiency and light emitting uniformity.

It should be noted that reference numbers of the components and a part of contents of the aforementioned embodiment are also used in the following embodiment, wherein the same reference numbers denote the same or like components, and descriptions of the same technical contents are omitted. The aforementioned embodiment can be referred for descriptions of the omitted parts, and detailed descriptions thereof are not repeated in the following embodiment.

Figure 2:
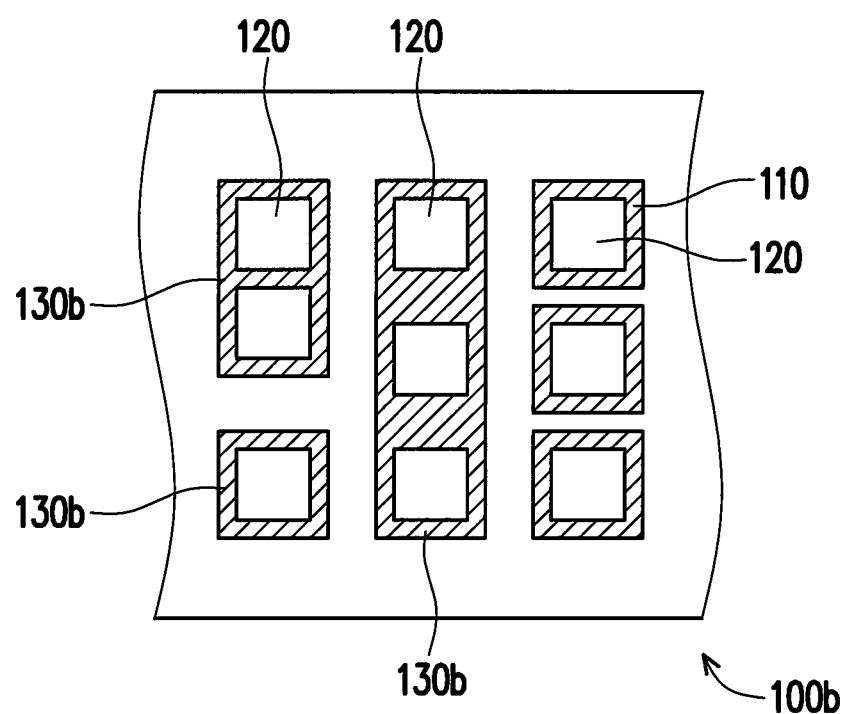
FIG. 2 is a partial top view of a light emitting device according to another embodiment of the invention.

FIG. 2 is a partial top view of a light emitting device according to another embodiment of the invention. Referring to FIG. 1 A and FIG. 2, the light emitting device 100b of the present embodiment is similar to the light emitting device 100a of FIG. 1A, and a main difference there between is that each of the reflective structures 130a of the light emitting device 100a of FIG. 1A corresponds to one micro light emitting chip 120, though the each of the reflective structures 130b in the light emitting device 100b of FIG. 2 may correspond to more than one micro light emitting chip 120, where the micro light emitting chips 120 can be light emitting chips of the same color or different colors, which is not limited by the invention.

Figure 3:
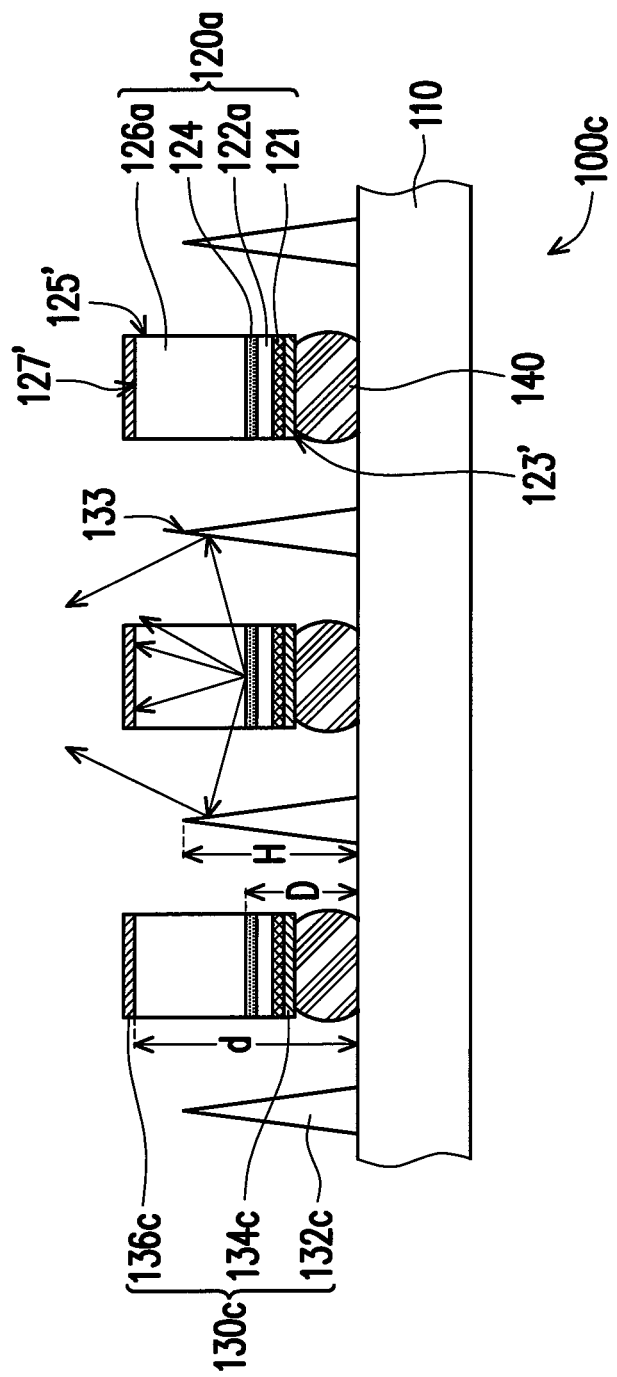
FIG. 3 is a cross-sectional view of a light emitting device according to another embodiment of the invention.

FIG. 3 is a cross-sectional view of a light emitting device according to another embodiment of the invention. Referring to FIG. 1A and FIG. 3, the light emitting device 100c of the present embodiment is similar to the light emitting device 100a of FIG. 1A, and a main difference there between is that a structure pattern of the micro light emitting chips 120a and configuration positions of the reflective structures 130c of the light emitting device 100c of the present embodiment are all different to the structure pattern of the micro light emitting chips 120 and the configuration positions of the reflective structures 130c of the light emitting device 100a of FIG. 1A.

In detail, in the micro light emitting chip 120 of FIG. 1A, an edge of the first type semiconductor layer 122, an edge of the light emitting layer 124, an edge of the second type semiconductor layer 126 and an edge of the bonding pad 121 are not aligned. However, in the micro light emitting chip 120a of the present embodiment, the edge of the first type semiconductor layer 122a, the edge of the light emitting layer 124, the edge of the second type semiconductor layer 126a and the edge of the bonding pad 121 are all aligned. A main reason causing the aforementioned structural difference is a manufacturing process variation, which does not influence essential functions of the micro light emitting chips 120, 120a. hi brief, a profile of the micro light emitting chip 120a of the present embodiment can be embodied as a rectangle, where an area of the second type semiconductor layer 126a of the micro light emitting chip 120a is slightly greater than an area of the first type semiconductor layer 122a.

The reflective structures 130c of the present embodiment includes a plurality of first reflective structures 132c, where the first reflective structures 132c are disposed on the substrate 110 in dispersion, and a height H of each of the first reflective structures 132c is greater than a distance D between the light emitting layer 124 of each of the micro light emitting chips 120a and the substrate 110. In other words, the first reflective structures 132c do not direct contact the micro light emitting chips 120a, but are disposed around the micro light emitting chips 120a. Moreover, the reflective structures 130c of the present embodiment further include a plurality of second reflective structures 134c, where each of the micro light emitting chips 120a has a lower surface 123', and the second reflective structures 134c are located between the lower surfaces 123' of the micro light emitting chips 120a and the conductive bumps 140. Namely, the second reflective structures 134c are disposed on the lower surfaces 123' of the micro light emitting chips 120a. Moreover, the reflective structures 130c of the present embodiment may further include a plurality of third reflective structures 136c, where each of the micro light emitting chips 120a has an upper surface 127' opposite to the lower surface 123', and the third reflective structures 136c are disposed on the upper surfaces 127' of the micro light emitting chips 120a, and the height H of each of the first reflective structures 132c is greater than the distance D between the light emitting layer 124 of each of the micro light emitting chips 120a and the substrate 110, and the height H of each of the first reflective structures 132c is smaller than a distance d between the upper surface 127' of each of the micro light emitting chips 120a and the substrate 110. A light reflectance of the reflective structures 130c is higher than 95%, and a material thereof is, for example, Ag, Ni, Al, Rh, Pd, Ir, Ru, Zn, Pt, Au, Hf and an alloy thereof, and at least one of the above materials is adopted to form a single layer structure or a multi-layer structure.

Since the height H of each of the first reflective structures 132c of the light emitting device 100c is greater than the distance D between the light emitting layer 124 of each of the micro light emitting chips 120a and the substrate 110, the light emitted by the light emitting layers 124 of the micro light emitting chips 120a can be reflected by the first reflective structures 132c to emit forward. In this way, the forward light flux of the light emitting device 100c can be effectively enhanced, such that the light emitting device 100c has better light emitting efficiency. Moreover, configuration of the second reflective structures 134c and the third reflective structures 136c may effectively enhance a reflection effect of the lights emitted by the light emitting layers 124 of the micro light emitting chips 120a, such that the light emitting device 100c of the present embodiment may have better light emitting uniformity. In brief, the light emitting device 100c of the present embodiment has better light emitting efficiency and light emitting uniformity.

Figure 4:
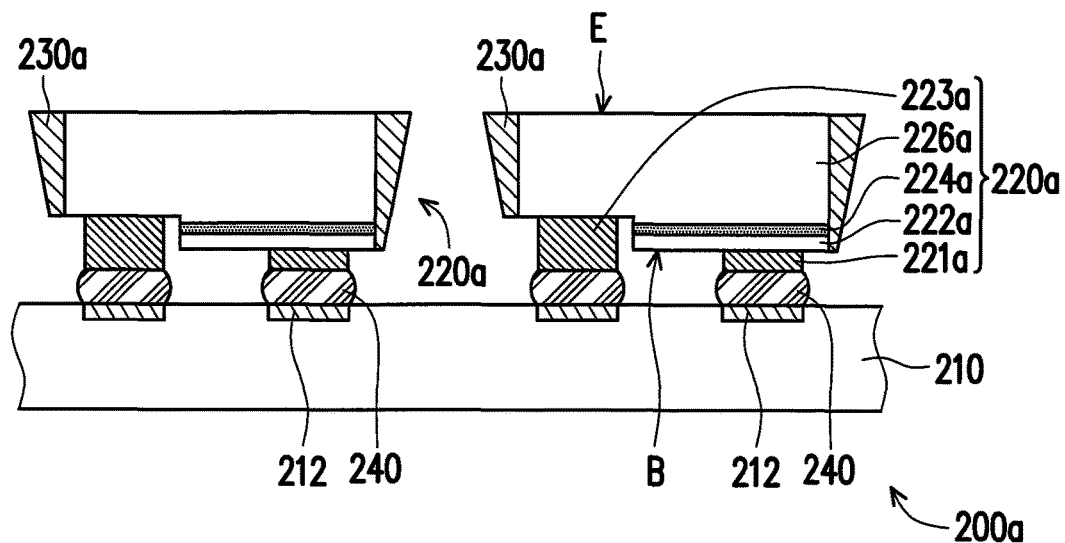
FIG. 4 is a cross-sectional view of a light emitting device according to another embodiment of the invention.

FIG. 4 is a cross-sectional view of a light emitting device according to another embodiment of the invention. Referring to FIG. 1A and FIG. 4, the light emitting device 200a of the present embodiment is similar to the light emitting device 100a of FIG. 1A, and a main difference there between is that each of micro light emitting chips 220a is a flip chip type micro LED.

In detail, the light emitting device 200a includes a substrate 210, a plurality of micro light emitting chips 220a, a plurality of reflective structures 230a and a plurality of conductive bumps 240. The substrate 210 has a plurality of pads 212. The micro light emitting chips 220a are disposed on the substrate 210 separately, and each of the micro light emitting chips 220a includes a light emitting layer 224a, a first type electrode 221a and a second type electrode 223a isolated from the first type electrode 221a, wherein the first type electrode 221a and the second type electrode 223a are disposed on one side of the light emitting layer 224a. In other words, the first type electrode 221a and the second type electrode 223a are arranged on the same side of the light emitting layer 224a. The reflective structures 230a are physically separated from each other. Each of the reflective structures 230a is disposed around one of the micro light emitting chips 220a, the reflective structures 230a are spaced apart from the substrate 210. The conductive bumps 240 are disposed corresponding to the first type electrodes 221a and the second type electrodes 223a, and the conductive bumps 240 are located between the micro light emitting chips 220a and the substrate 210, where the micro light emitting chips 220a are electrically bonded to the pads 212 of the substrate 210 through the conductive bumps 240.

Furthermore, as shown in FIG. 4, each of the micro light emitting chips 220a further includes a first type semiconductor layer 222a and a second type semiconductor layer 226a. The light emitting layer 224a is located between the first type semiconductor layer 222a and the second type semiconductor layer 226a. The first type electrode 221a is electrically connected to the first type semiconductor layer 222a, and the second type electrode 223a is electrically connected to the second type semiconductor layer 226a. The reflective structures 230a are disposed around the micro light emitting chips 220a respectively, in other words, the reflective structures 230a are formed on side surfaces of the micro light emitting chips 220a. A thickness of one of the reflective structures 230a is thinning gradually toward the substrate 210. Namely, the thickness of one of the reflective structures 230a is not uniform. Furthermore, each micro light emitting chips 220a includes a bonding surface B adjacent to the substrate 210 and a light-emitting surface E disposed opposite the bonding surface B. The thickness of one of the reflective structures 230a is thinning gradually from the light-emitting surface E to the bonding surface B. Herein, a material of the reflective structures 230a is an insulating material, and each of the reflective structures 230a is a single layer structure or a multi-layer structure, such as distributed Bragg reflector, which is not limited by the invention.

Figure 5:
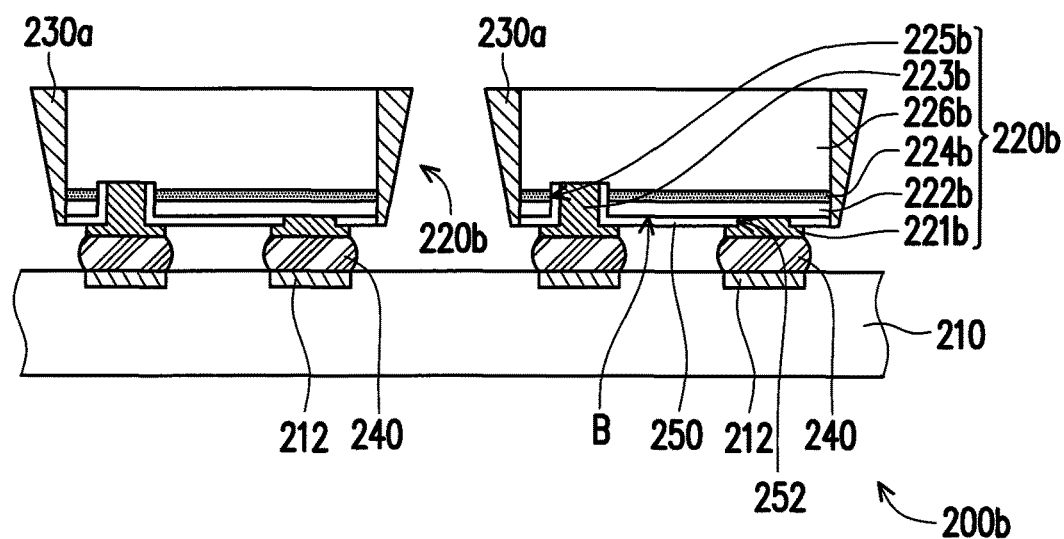
FIG. 5 is a cross-sectional view of a light emitting device according to another embodiment of the invention.

FIG. 5 is a cross-sectional view of a light emitting device according to another embodiment of the invention. Referring to FIG. 4 and FIG. 5, the light emitting device 200b of the present embodiment is similar to the light emitting device 200a of FIG. 4, and a main difference there between is that each of micro light emitting chips 220b further includes a via hole 225b and an insulating layer 250, and the via hole 225b penetrates through the first type semiconductor layer 222b, the light emitting layer 224b and exposes a portion of the second type semiconductor layer 226b. The second type electrode 223b is disposed within the via hole 225b to electrically connect to the second type semiconductor layer 226b.

Each of the insulating layers 250 is disposed on the first type semiconductor layer 222b and a sidewall of the via hole 225b, wherein each of the insulating layers 250 exposes a portion of the first type semiconductor layer 222b to form a contact opening 252. The first type electrode 221b is disposed in the contact opening 252 and electrically connected to the first type semiconductor layer 222b. In addition, a portion of the insulating layer 250 is located between the side wall of the via hole 225b and the second type electrode 223b. Each of the insulating layers 250 is disposed to electrically insulate the first type semiconductor layer 222b and the second type electrode 223b.

Figure 6:
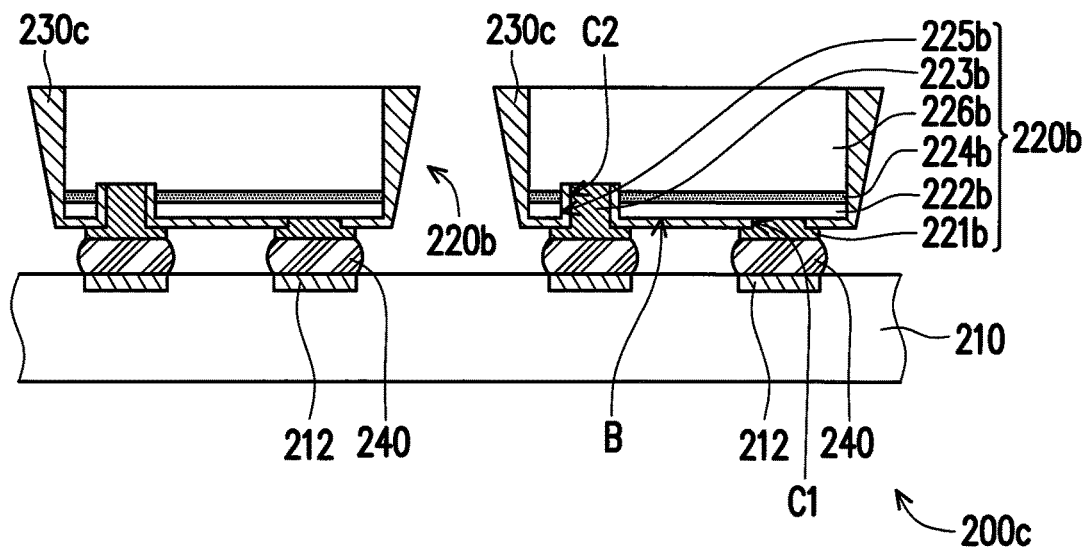
FIG. 6 is a cross-sectional view of a light emitting device according to another embodiment of the invention.

FIG. 6 is a cross-sectional view of a light emitting device according to another embodiment of the invention. Referring to FIG. 5 and FIG. 6, the light emitting device 200c of the present embodiment is similar to the light emitting device 200b of FIG. 5, and a main difference there between is that each of the reflective structures 230c extends to the bonding surface B of one of the micro light emitting chips 220b and comprises a first contact opening C1 and a second contact opening C2 separated from the first contact opening C1. The first contact opening C1 exposes the first type semiconductor layer 222b, the second contact opening C2 is disposed in the via hole 225b and exposes the second type semiconductor layer 226b, and the first type electrode 221b is disposed in the first contact opening C1 to contact the first type semiconductor layer 222b, the second type electrode 223b is disposed in the second contact opening C2 to contact the second type semiconductor layer 226b. Since the material of the reflective structures 230c is an insulating material, each of the reflective structures 230c within the side wall of the via hole 225b is disposed to electrically insulate the first type semiconductor layer 222b and the second type electrode 223b.

Figure 7:
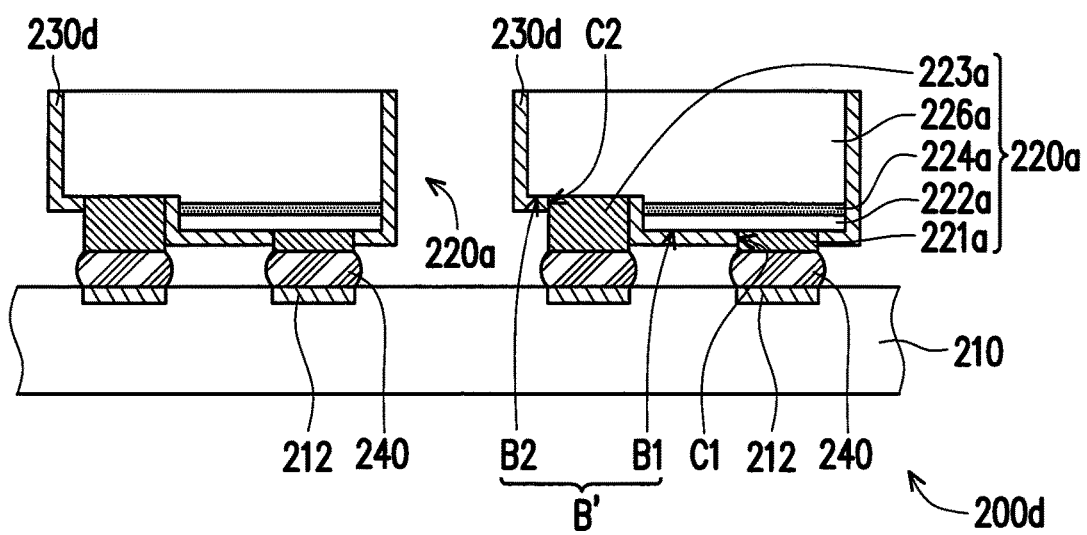
FIG. 7 is a cross-sectional view of a light emitting device according to another embodiment of the invention.

FIG. 7 is a cross-sectional view of a light emitting device according to another embodiment of the invention. Referring to FIG. 4 and FIG. 7, the light emitting device 200d of the present embodiment is similar to the light emitting device 200a of FIG. 4, and a main difference there between is that each of the reflective structures 230d extends to a bonding surface B' of one of the micro light emitting chips 220a, wherein the bonding surface B' is relatively adjacent to the substrate 210. The bonding surface B' includes a surface B1 of the first type semiconductor layer 222a and a surface B2 of the second type semiconductor layer 226a. Each of the reflective structures 230d exposes a portion of the surface B1 of the first type semiconductor layer 222a to form a first contact opening C1, and the first type electrode 221a is disposed in the first contact opening C1. Each of the reflective structures 230d exposes a portion of the surface B2 of the second type semiconductor layer 226a to form a second contact opening C2, and the second type electrode 223a is disposed in the second contact opening C2. Herein, each of the reflective structures 230d directly covers side surfaces of the first type semiconductor layer 222a, side surfaces of the second type semiconductor layer 226a and side surfaces of the light emitting layer 224a of one of the micro light emitting chips 220a at the same thickness.

In summary, since the light emitting device of the invention has the reflective structures, where the reflective structures are disposed around the micro light emitting chips, and at least cover the light emitting layers of the micro light emitting chips, a forward light flux of the light emitting device is enhanced and a lateral light flux thereof is decreased. Moreover, by using the reflective structures, the lights emitted by the light emitting layers of the micro light emitting chips may have a uniform light emitting effect through reflection. In this way, the light emitting device of the invention may achieve better light emitting efficiency and light emitting uniformity.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A light emitting device, comprising:
a substrate, having a plurality of pads;
a plurality of micro light emitting chips, disposed on the substrate separately, and each of the micro light emitting chips comprising a light emitting layer, a first type electrode and a second type electrode separated from the first type electrode, wherein the first type electrode and the second type electrode are disposed on one side of the light emitting layer;
a plurality of reflective structures, physically separated from each other and spaced apart from the substrate, wherein each of the reflective structures is disposed around one of the micro light emitting chips; and
a plurality of conductive bumps, disposed corresponding to the micro light emitting chips and located between the micro light emitting chips and the substrate, wherein the micro light emitting chips are electrically bonded to the pads of the substrate through the conductive bumps,
wherein each of the micro light emitting chips further comprises a first type semiconductor layer, a second type semiconductor layer, a via hole, and an insulating layer, the light emitting layer is located between the first type semiconductor layer and the second type semiconductor layer, the first type electrode is electrically connected to the first type semiconductor layer, and the second type electrode is electrically connected to the second type semiconductor layer, the via hole penetrates through the first type semiconductor layer and the light emitting layer, and the second type electrode is disposed within the via hole to electrically contact the second type semiconductor layer, the insulating layer is disposed on the first type semiconductor layer and a sidewall of the via hole, the insulating layer exposes a portion of the surface of the first type semiconductor layer to form a contact opening, and the first type electrode is disposed on the contact opening to contact the first type semiconductor layer, and the insulating layer exposes the second type semiconductor layer in the via hole, and the first type electrode and the second type electrode are disposed between the substrate and the first type semiconductor layer,
wherein a thickness of one of the reflective structures is thinning gradually toward the substrate, and each of the reflective structures directly covers side surfaces of the first semiconductor layer and side surfaces of the light emitting layer of each of the micro light emitting chips.

2. The light emitting device as claimed in claim 1, wherein the reflective structures and the insulating layer are the same layer in each of the micro light emitting chips.

3. The light emitting device as claimed in claim 1, wherein a material of the reflective structures is an insulating material.

4. The light emitting device as claimed in claim 3, wherein each of the reflective structures is a multi-layer structure.

5. The light emitting device as claimed in claim 1, wherein a maximum peak current density of an external quantum efficiency curve of each of the micro light emitting chips is between 0.01 A/cm$^2$ and 2 A/cm$^2$.

6. The light emitting device as claimed in claim 1, wherein a defect density of each of the micro light emitting chips is between $10^4$/cm$^2$ and $10^8$/cm$^2$.

* * * * *